United States Patent
Wang

(10) Patent No.: US 6,457,110 B1
(45) Date of Patent: Sep. 24, 2002

(54) METHOD OF ACCESSING SYNCRONOUS DYNAMIC RANDOM ACCESS MEMORY IN SCANNER

(75) Inventor: Kuo-Jeng Wang, Kaohsiung (TW)

(73) Assignee: Umax Data Systems, Inc., Hsinchu (TW)

(*) Notice: Subject to any disclaimer, the term of this patent is extended or adjusted under 35 U.S.C. 154(b) by 32 days.

(21) Appl. No.: 09/810,678

(22) Filed: Mar. 16, 2001

(51) Int. Cl.[7] ................................. G06F 12/02
(52) U.S. Cl. ..................... 711/168; 711/5; 711/169; 711/105
(58) Field of Search .................. 711/5, 168, 169, 711/173, 105; 365/189.04, 189.05

(56) References Cited

U.S. PATENT DOCUMENTS

| | | | | |
|---|---|---|---|---|
| 4,120,048 A | * | 10/1978 | Fuhrman | 365/189.04 |
| 5,261,064 A | * | 11/1993 | Wyland | 365/189.04 |
| 5,581,310 A | * | 12/1996 | Vinekar et al. | 345/531 |
| 5,715,421 A | * | 2/1998 | Akiyama et al. | 365/203 |
| 6,278,645 B1 | * | 8/2001 | Buckelew et al. | 348/555 |
| 6,289,413 B1 | * | 9/2001 | Rogers et al. | 711/105 |
| 6,339,552 B1 | * | 1/2002 | Taruishi et al. | 365/189.05 |

* cited by examiner

*Primary Examiner*—Hiep T. Nguyen
(74) *Attorney, Agent, or Firm*—J.C. Patents

(57) ABSTRACT

A method of reading data from a synchronous dynamic random access memory inside a scanner. The synchronous dynamic random access memory has a plurality of memory banks. A batch of random access data is stored inside any one of the memory banks and a batch of burst data capable of operating in the burst mode is stored in any other memory bank. The command for reading the random number data and the burst mode command for transmitting burst mode data are issued concurrently.

4 Claims, 2 Drawing Sheets

| | CLK1 | CLK2 | CLK3 | CLK4 | CLK5 | CLK6 | CLK7 | CLK8 | CLK9 | CLK10 |
|---|---|---|---|---|---|---|---|---|---|---|
| COM | trigger A | nop | trigger B | read A | nop | nop | nop | read B | nop | pre-charge |
| DQ | gamma3 | | | | | | data0-0 | data0-1 | data0-2 | data0-3 |

| | CLK11 | CLK12 | CLK13 | CLK14 | CLK15 | CLK16 | CLK17 | CLK18 | CLK19 | CLK20 |
|---|---|---|---|---|---|---|---|---|---|---|
| COM | trigger B | nop | trigger B | read A | nop | nop | nop | read B | nop | pre-charge |
| DQ | gamma0 | | | | | | data1-0 | data1-1 | data1-2 | data1-3 |

| | CLK21 | CLK22 | CLK23 | CLK24 | CLK25 | CLK26 | CLK27 | CLK28 | CLK29 | CLK30 |
|---|---|---|---|---|---|---|---|---|---|---|
| COM | trigger A | nop | trigger B | read A | nop | nop | nop | read B | nop | pre-charge |
| DQ | gamma1 | | | | | | data2-0 | data2-1 | data2-2 | data2-3 |

| | CLK31 | CLK32 | CLK33 | CLK34 | CLK35 | CLK36 | CLK37 | CLK38 | CLK39 | CLK40 |
|---|---|---|---|---|---|---|---|---|---|---|
| COM | trigger A | nop | trigger B | write A | nop | nop | nop | read B | nop | pre-charge |
| DQ | gamma2 | | | data3-0 | data3-1 | data3-2 | data3-3 | Hi-Z | | |

| | CLK1 | CLK2 | CLK3 | CLK4 | CLK5 | CLK6 | CLK7 | CLK8 | CLK9 | CLK10 |
|---|---|---|---|---|---|---|---|---|---|---|
| COM | trigger A | nop | trigger B | read A | nop | nop | nop | read B | nop | pre-charge |
| DQ | gamma3 | | | | | | data0-0 | data0-1 | data0-2 | data0-3 |

| | CLK11 | CLK12 | CLK13 | CLK14 | CLK15 | CLK16 | CLK17 | CLK18 | CLK19 | CLK20 |
|---|---|---|---|---|---|---|---|---|---|---|
| COM | trigger B | nop | trigger B | read A | nop | nop | nop | read B | nop | pre-charge |
| DQ | gamma0 | | | | | | data1-0 | data1-1 | data1-2 | data1-3 |

| | CLK21 | CLK22 | CLK23 | CLK24 | CLK25 | CLK26 | CLK27 | CLK28 | CLK29 | CLK30 |
|---|---|---|---|---|---|---|---|---|---|---|
| COM | trigger A | nop | trigger B | read A | nop | nop | nop | read B | nop | pre-charge |
| DQ | gamma1 | | | | | | data2-0 | data2-1 | data2-2 | data2-3 |

| | CLK31 | CLK32 | CLK33 | CLK34 | CLK35 | CLK36 | CLK37 | CLK38 | CLK39 | CLK40 |
|---|---|---|---|---|---|---|---|---|---|---|
| COM | trigger A | nop | trigger B | write A | nop | nop | nop | read B | nop | pre-charge |
| DQ | gamma2 | | | data3-0 | data3-1 | data3-2 | data3-3 | Hi-Z | | |

FIG. 2

METHOD OF ACCESSING SYNCRONOUS DYNAMIC RANDOM ACCESS MEMORY IN SCANNER

BACKGROUND OF THE INVENTION

1. Field of Invention

The present invention relates to a method of reading data from the memory inside a scanner. More particularly, the present invention relates to a method of reading data from a synchronous dynamic random access memory (SDRAM) inside a scanner.

2. Description of Related Art

A scanner that uses dynamic random access memory (DRAM) can only access a batch of data in a memory at a time. Since the data access rate may directly affect the image-processing speed of a scanner, a fast-acting synchronous dynamic random access memory (SDRAM) is routinely employed to reduce the image-processing bottleneck.

Although SDRAM has a higher data access rate than DRAM due to a burst mode, the advantage of the burst mode in a scanner is not always realized. This is due to that some of the data in a scanner are stored as random numbers, for example, in a gamma table.

SUMMARY OF THE INVENTION

Accordingly, one object of the present invention is to provide a method of reading data from a synchronous dynamic random access memory (SDRAM) inside a scanner. The reading method utilizes the burst mode and the multi-bank arrangement of a SDRAM for a faster data read-out rate.

To achieve these and other advantages and in accordance with the purpose of the invention, as embodied and broadly described herein, the invention provides a method of reading data from a synchronous dynamic random access memory (SDRAM) inside a scanner. The SDRAM has a plurality of memory banks. A batch of random access data is stored inside any one of the memory banks and a batch of burst data capable of operating in the burst mode is stored in any other memory bank. The command for reading the random number data and the burst mode command for transmitting burst mode data are issued concurrently.

In addition, a pre-charge command for pre-charging the memory bank holding the random number data is executed before obtaining the random number data.

In brief, irregular data such as the data in a gamma table are independently stored in a memory bank inside a SDRAM. Hence, interleave bank access and burst mode transmission can be executed together when random access is required. As a result, there is no need to wait commands for pre-charging and triggering the memory bank before initiating data access, all of which conventionally occur in the same memory bank.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings, FIG. 2 is a timing diagram showing the commands and data according to one preferred embodiment of this invention.

DESCRIPTION OF THE PREFERRED EMBODIMENTS

Figure 1:
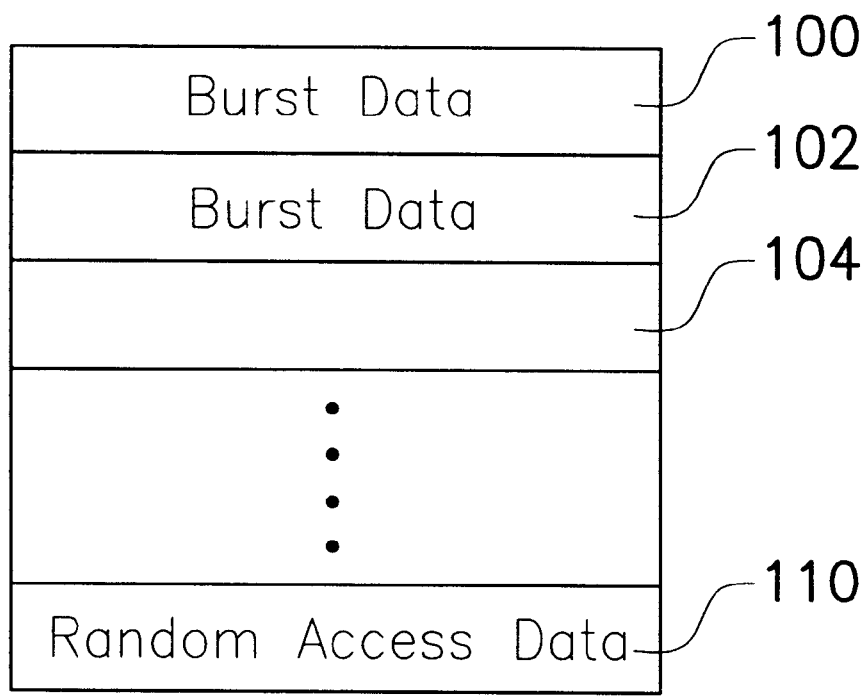
FIG. 1 is a sketch showing the data storage regions inside a synchronous dynamic random access memory (SDRAM) according to one preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a sketch showing the data storage regions inside a synchronous dynamic random access memory (SDRAM) according to one preferred embodiment of this invention. In this embodiment, a SDRAM 10 having a plurality of memory banks 100, 102, 104 and 110 is provided. Random access data is independently stored in the memory bank 110. However, other burst data, which can be transmitted through a burst mode are stored in memory banks other than memory bank 110, such as memory banks 100 and 102. Preferably, the random access data includes a gamma table, while the burst mode data includes compensation data which can be transmitted in the burst mode.

The embodiment is further described by referring to FIG. 2 that is a periodic diagram showing the commands and data according to one preferred embodiment of this invention together with FIG. 1. In this embodiment, the memory bank 100 shown in FIG. 1 is set to be a memory bank A as referred in FIG. 2, while the memory bank 110 shown in FIG. 1 is the memory bank B as referred in FIG. 2. Moreover, a data length of four and a latency period of three can be transmitted at one time in the burst mode from the SDRAM 10 described herein, with forty clock cycles constituting a loop. In addition, a row labeled COM indicates the commands issued to the SDRAM 10 and a row labeled DQ indicates the data accessed from the SDRAM 10.

First of all, in clock cycle 1 (CLK1), a command COM issued to the SDRAM 10 triggers the memory bank A (memory bank 100). Then, in clock cycle 3 (CLK3), another command COM issued to the SDRAM 10 triggers the memory bank B (memory bank 110). Next, in clock cycle 4 (CLK4), a read command issued to the memory bank A will lead to the execution of a burst mode transmission after a latency period (in this embodiment, three clock cycles). Note that while the read command is issued to the memory bank A, the memory bank A of the SDRAM 10 will automatically be pre-charged. Hence, no extra one clock cycle is needed to send out pre-charge command to the memory bank A. However, a read data command is issued to the memory bank B in clock cycle 8 (CLK 8). And after the memory bank B is pre-charged in clock cycle 10 (CLK10), data in the memory bank B are retrieved in clock cycle 11

Since the operations from clock cycle 11 (CLK1 1) to clock cycle 30 (CLK30) are similar to the aforementioned steps described from CLK 1 to CLK 10, the only difference being different data are read. Hence, detail description is omitted.

In clock cycle 31 (CLK3 1), a command COM issued to the SDRAM 10 triggers the memory bank A. After that, in clock cycle 33 (CLK33), another command COM issued to the SDRAM 10 triggers the memory bank B. Next, in clock cycle 34 (CLK34), a write command issued to the memory bank A will initiate a data transmission in the burst mode during clock cycle 34 (CLK 34). In the meantime, the memory bank A of the SDRAM 10 will automatically be pre-charged. Hence, no extra one clock cycle is needed to send out pre-charge command to the memory bank A. However, a read data command is issued to the memory bank B in clock cycle 38 (CLK38). After pre-charging the memory bank in clock cycle 40 (CLK40), data inside the memory bank B are retrieved in the next clock cycle. Since the loop consists of 40 clock cycles is used in this embodiment, the last batch of data (gamma3) read out from the memory bank B is illustrated as the transmitted data DQ under clock cycle 1 (CLK1).

Moreover, as a write command and a read command are respectively issued in clock cycle 34 (CLK34) and clock cycle 38 (CLK38), a high impedance (Hi-Z) state must be established in the data bus between a read-out data and a write-out data in order to support a proper data transmission. Indeed, it is not necessary for the high impedance state to come right after the read-out data (in other words, the Hi-Z state does not have to follow immediately after data 3—3).

Since the SDRAM 10 of the invention has a latency period of 3, the triggering of the memory bank A (in clock cycles 1, 11, 21, 31) and the triggering of the memory bank B (in clock cycles 3, 13, 23, 33) must be separated by at least one clock cycle to provide proper function of the SDRAM 10. In other words, when other parameters of the SDRAM are used, a sequence of commands must be executed based on the sequence provided by the embodiment of this invention.

Furthermore, the loop consisting of 40 clock cycles is chosen in the embodiment, various commands are not necessarily sequenced with the shortest time as a main consideration. For example, the read command issued to the memory bank B in clock cycle 38 (CLK38) can be issued in clock cycle 36 (CLK36) instead so that the data are read out from the memory bank B immediately after the high impedance. In other words, a command for accessing the memory bank B is best described as one which enables transmission of data required in the memory bank B to occur immediately after accessing the data in the memory bank A. In this case, it is equivalent to a minimum possible clock cycle, such as CLK 36. Note that when there are different types of access to the memory banks A and B, such as reading data from memory bank A and writing data into memory bank B, or writing data into memory bank A and reading data from memory bank B, a high impedance state must be inserted in the data bus between transmitted data from two memory banks. Consequently, timing of the access command to the memory bank B is based on the consideration that memory bank B data can follow the high-impedance state with the smallest value.

In conclusion, irregular data such as the data in a gamma table are independently stored in a memory bank inside a SDRAM in this invention. And with the interleave bank reading mode, the random access transmission and the burst mode transmission can be executed together. As a result, there is no need to wait commands for pre-charging and triggering the memory bank before initiating data access, all of which conventionally occur in the same memory bank. This increases the frequency of SDRAM usage in a scanner.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of reading data from a synchronous dynamic random access memory inside a scanner, wherein the synchronous dynamic random access memory has a plurality of memory banks, the method comprising the steps of:

holding random access data in any one of the memory banks;

holding data capable of burst mode transmission in other memory banks; and transmitting a burst mode command to initiate burst data transmission and a random data read command to read random access data at the same time;

wherein a pre-charge command for pre-charging the memory bank holding random access data is executed before retrieving the random access data.

2. The method of claim 1, wherein the random access data include data in a gamma table.

3. The method of claim 1, wherein the number of cycles between the issue of the random data transmission command and the issue of the burst data transmission command before the random data transmission command is selected such that the random access data is able to follow the burst data with minimal number of intervening cycles.

4. The method of claim 3, wherein the random access data includes data in a gamma table.

* * * * *